(12) United States Patent
Yang et al.

(10) Patent No.: US 11,178,763 B2
(45) Date of Patent: Nov. 16, 2021

(54) FLEXIBLE PRINTED CIRCUIT BOARD AND ELECTRONIC DEVICE COMPRISING SAME

(71) Applicant: Samsung Electronics Co., Ltd., Suwon-si (KR)

(72) Inventors: Seohoon Yang, Suwon-si (KR); Shihyun Kim, Suwon-si (KR); Juneyoung Hur, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/961,454

(22) PCT Filed: Jan. 15, 2019

(86) PCT No.: PCT/KR2019/000570
§ 371 (c)(1),
(2) Date: Jul. 10, 2020

(87) PCT Pub. No.: WO2019/143088
PCT Pub. Date: Jul. 25, 2019

(65) Prior Publication Data
US 2021/0084764 A1  Mar. 18, 2021

(30) Foreign Application Priority Data

Jan. 16, 2018  (KR) .................. 10-2018-0005723

(51) Int. Cl.
*H05K 1/11*     (2006.01)
*H04M 1/02*     (2006.01)
(Continued)

(52) U.S. Cl.
CPC .......... *H05K 1/118* (2013.01); *H04M 1/0262* (2013.01); *H04M 1/0277* (2013.01);
(Continued)

(58) Field of Classification Search
CPC ........ H05K 1/118; H05K 1/028; H05K 1/189; H05K 2201/10037; H05K 2201/055; H05K 1/147; H04M 1/0262; H04M 1/0277
(Continued)

(56) References Cited

U.S. PATENT DOCUMENTS 9,900,999 B1 * 2/2018 Lim ................. H04R 1/025
2008/0167073 A1 * 7/2008 Hobson ............. H01Q 9/0421
455/557
(Continued)

FOREIGN PATENT DOCUMENTS

JP  2001-358422 A  12/2001
JP  2009-053674 A  3/2009
(Continued)

OTHER PUBLICATIONS

Gigglehd.com, Galaxy S8, Galaxy S8+ exploded picture, https://www.ifixit.com/Teardown/Samsung+Galaxy+S8++Teardown/87086, Apr. 18, 2017.

*Primary Examiner* — Sherman Ng
(74) *Attorney, Agent, or Firm* — Jefferson IP Law, LLP

(57) ABSTRACT

An electronic device according to one embodiment of the present disclosure can comprise: a housing including a front plate and a rear plate faced away from the front plate; a first printed circuit board arranged between the front plate and the rear plate; an electronic component arranged between the front plate and the rear plate and on a first plane that is substantially the same as the first printed circuit board; and a second printed circuit board for connecting the electronic component to the first printed circuit board, wherein the second printed circuit board comprises: a first terminal part parallel to the first plane and connected to the electronic component; a second terminal part parallel to the first terminal part and connected to the printed circuit board; a (Continued)

first planar part extending from the first terminal part toward the second terminal part and parallel to a second plane that is substantially orthogonal to the first plane; a second planar part extending from the second terminal part toward the first terminal part, parallel to the second plane, and faced away from the first planar part; and a connection part extending from each of the first planar part and the second planar part toward a third plane that is substantially orthogonal to the first plane and the second plane, and bent so as to connect the first planar part and the second planar part. Other various embodiments are possible.

18 Claims, 13 Drawing Sheets

(51) Int. Cl.
*H05K 1/02* (2006.01)
*H05K 1/18* (2006.01)

(52) U.S. Cl.
CPC ............ *H05K 1/028* (2013.01); *H05K 1/189* (2013.01); *H05K 2201/10037* (2013.01)

(58) Field of Classification Search
USPC .......................................... 361/749; 174/254
See application file for complete search history.

(56) References Cited

U.S. PATENT DOCUMENTS

| | | | |
|---|---|---|---|
| 2009/0262030 A1* | 10/2009 | Zweers | H01Q 1/243 343/702 |
| 2013/0053106 A1 | 2/2013 | Kwong et al. | |
| 2014/0295921 A1* | 10/2014 | Kato | H05K 1/0213 455/575.1 |
| 2015/0373830 A1* | 12/2015 | Miyagawa | H05K 1/028 174/520 |
| 2016/0276647 A1* | 9/2016 | Lee | H01M 50/572 |
| 2016/0276757 A1 | 9/2016 | Smith et al. | |
| 2016/0294086 A1* | 10/2016 | Kim | H05K 1/02 |
| 2018/0288889 A1* | 10/2018 | Fordham | H01R 12/79 |

FOREIGN PATENT DOCUMENTS

| | | |
|---|---|---|
| KR | 10-2005-0040379 A | 5/2005 |
| KR | 10-1257768 B1 | 5/2013 |
| KR | 10-2017-0014629 A | 2/2017 |

* cited by examiner

FLEXIBLE PRINTED CIRCUIT BOARD AND ELECTRONIC DEVICE COMPRISING SAME

TECHNICAL FIELD

Various embodiments of the disclosure relate to a flexible printed circuit board and an electronic device including the same.

BACKGROUND ART

Electronic devices, such as mobile phones, tablet PCs, and notebook PCs, capable of providing various functions while being carried by a user are widely used. Such electronic devices may include various electronic components in order to provide various functions to a user. Electronic components included inside electronic devices may be electrically or operatively connected to each other by means of various connection methods. Such electronic components may be provided with power from batteries included inside electronic devices. For example, batteries, through flexible printed circuit boards, may be electrically connected to printed circuit boards on which power management modules configured to control power supplied to electronic components are mounted.

DISCLOSURE OF INVENTION

Technical Problem

It is important that electronic devices have impact resistance capable of withstanding an external impact such as being dropped. Particularly, an external impact to electronic devices may cause a direct impact to a flexible printed circuit board connecting a battery and a printed circuit board. Furthermore, when a battery and/or a printed circuit board fixed within an electronic device moves (locomotion) due to an external impact to the electronic device, an indirect impact may be applied to a flexible printed circuit board connecting the battery and the printed circuit board. Various embodiments of the disclosure are to provide a flexible printed circuit board having a cushioning structure capable of preventing such an impact from causing damage.

Solution to Problem

An electronic device according to one embodiment of the disclosure may include: a housing including a front plate and a rear plate facing away from the front plate; a first printed circuit board disposed between the front plate and the rear plate; an electronic component disposed between the front plate and the rear plate and disposed on a first plane which is substantially identical to the first printed circuit board; and a second printed circuit board connecting the electronic component to the first printed circuit board, wherein the second printed circuit board may include: a first end portion which is portion parallel to the first plane and is connected to the electronic component; a second end portion which is parallel to the first end portion and is connected to the first printed circuit board; a first flat surface part which extends from the first end portion toward the second end portion and is parallel to a second plane substantially perpendicular to the first plane; a second flat surface part, which extends from the second end portion toward the first end portion, is parallel to the second plane, and faces away from the first flat surface part; and a connection part, which extends from each of the first flat surface part and the second flat surface part toward a third plane substantially perpendicular to the first plane and the second plane, and is bent so as to connect the first flat surface part and the second flat surface part.

Advantageous Effects of Invention

A flexible printed circuit board according to various embodiments of the disclosure can cushion an impact applied from all directions even while occupying a small mounting space in an electronic device.

BEST MODE FOR CARRYING OUT THE INVENTION

Figure 1:
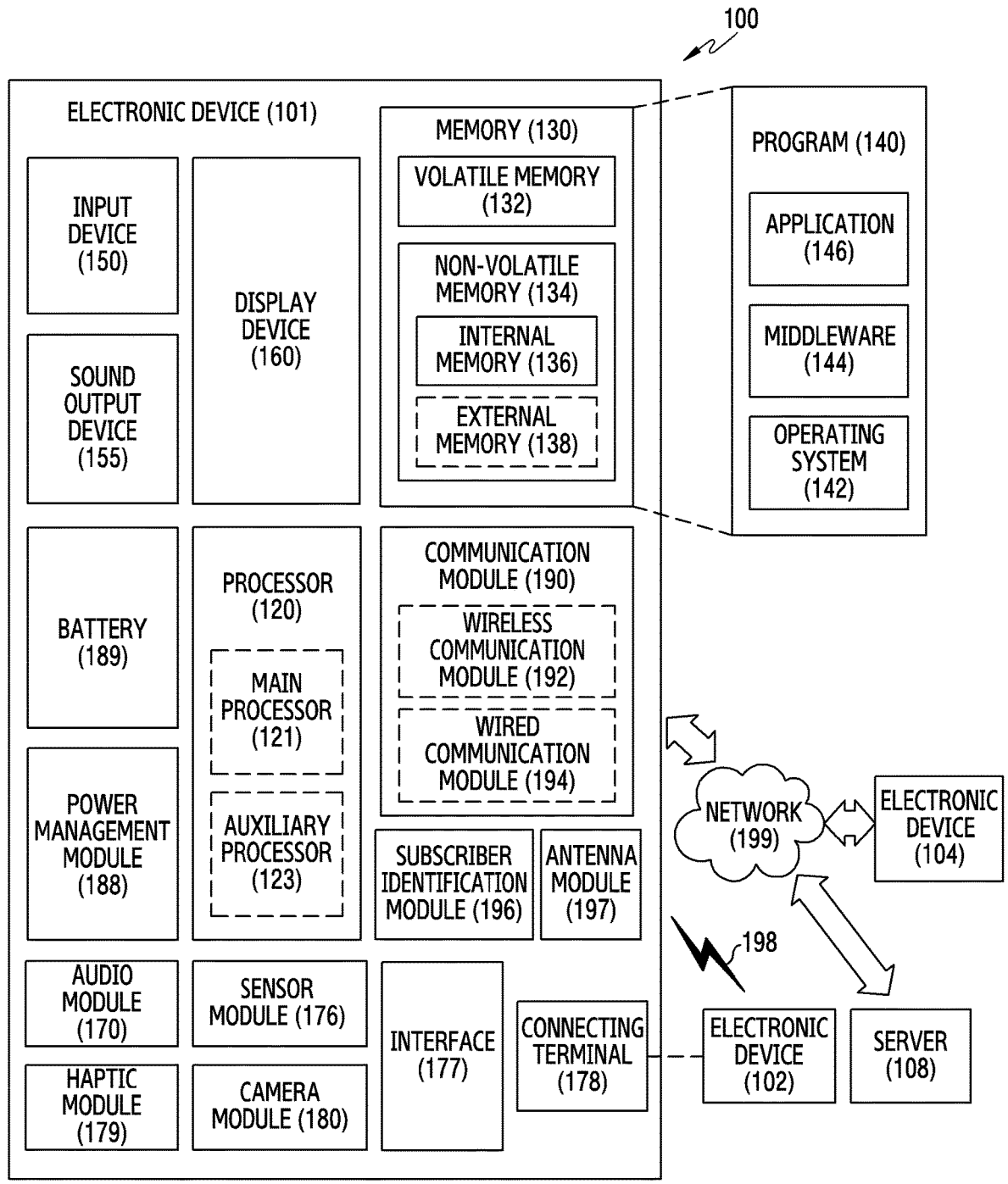
FIG. 1 is a block view of an electronic device within a network environment according to various embodiments of the disclosure.

Hereinafter, various embodiments of the disclosure will be described in detail with reference to the accompanying drawings. It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements.

As used herein, the expression "have", "may have", "include", or "may include" refers to the existence of a corresponding feature (e.g., numeral, function, operation, or constituent element such as component) and does not exclude the existence of additional features.

As used herein, the expression "A or B", "at least one of A and/or B", or "one of more of A and/or B" may include all possible combinations of items enumerated together. For example, "A or B", "at least one of A and B", or "at least one of A or B" may refer to all of (1) including at least one A, (2) including at least one B, or (3) including all of at least one A and at least one B.

The expressions "a first", "a second", "the first", "the second", and the like as used in various embodiments may modify various elements regardless of the order and/or the importance thereof, and do not limit the corresponding elements. These expressions may be used to distinguish between one element and any other element. For example, a first element may be termed a second element, and similarly, a second element may be termed a first element without departing from the scope of the disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it should be understood that when an element (e.g., first element) is referred to as being "directly connected," or "directly coupled" to another element (second element), there are no element (e.g., third element) interposed between them.

The expression "configured to" used in the disclosure may be interchangeably used with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

An electronic device according to various embodiments of the disclosure may include at least one of, for example, a smartphone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device (e.g., smart glasses, head-mounted device (HMD)), electronic clothing, electronic bracelet, electronic necklace, electronic appcessory, electronic tattoo, smart mirror, or smart watch).

According to some embodiments, the electronic device may include at least one of, for example, a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to other embodiments, the electronic device may include at least one of various medical devices (e.g., various portable medical measuring devices (blood glucose monitoring device, heart rate monitoring device, blood pressure measuring device, body temperature measuring device, etc.), magnetic resonance angiography (MRA), magnetic resonance imaging (MRI), computed tomography (CT) machine, ultrasonic machine, etc.), a navigation device, a global positioning system (GPS) receiver, an event data recorder (EDR), a flight data recorder (FDR), a vehicle infotainment device, electronic equipment for a ship (e.g., ship navigation device, gyro-compass, etc.), avionics, a security device, an automobile head unit, a home or industrial robot, an automatic teller's machine (ATM) in banks, point of sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.).

According to some embodiments, the electronic device may include at least one of a part of furniture or a building/structure, an electronic board, an electronic signature receiving device, a projector, and various kinds of measuring instruments (e.g., water meter, electric meter, gas meter, radio wave meter, etc.). In various embodiments, the electronic device may be a flexible electronic device or a foldable electronic device. The electronic device according to various embodiments of the disclosure is not limited to the aforementioned devices, and may include a new electronic device according to the development of technology.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

In this case, the auxiliary processor 123 may control at least some of the functions or states associated with at least one component (e.g., display unit 160, sensor module 176, or communication module 190) among the components of the electronic device 101, for example, instead of the main processor 121 while the main processor 121 is in an inactive (e.g., sleep) state, or together with the main processor 121 while the main processor 121 is in an active (e.g., application execution) state. According to one embodiment, the auxiliary processor 123 (e.g., an image signal processor or a communication processor) may be implemented as a part of another component (e.g., camera module 180 or communication module 190) that is functionally related to the auxiliary processor 123. The memory 130 may store various data used by at least one component (e.g., processor 120 or sensor module 176) of electronic device 101, for example, software (e.g., program 140) and input or output data for instructions which are associated with the software. The memory 130 may include a volatile memory 132 or a non-volatile memory 134.

A program 140 is software stored in the memory 130 and may include, for example, an operation system 142, a middleware, or an application 146.

The input device 150 is a device from the outside (e.g., a user) of the electronic device 101, for receiving instructions or data to be used in a component (e.g., processor 120) of the electronic device 101, and may include, for example, a microphone, a mouse, or a keyboard.

The sound output device 155 is a device for outputting a sound signal to the outside of the electronic device 101 and may include, for example, a speaker for general use such as multimedia reproduction or sound reproduction, and a receiver used for telephone reception. According to one embodiment, the receiver may be formed integrally with or separately from the speaker.

The display device 160 is a device for visually providing information to a user of the electronic device 101 and may include, for example, a display, a hologram device, or a projector and a control circuit for controlling the corresponding device. According to one embodiment, the display device 160 may include a touch circuit, a pressure sensor capable of measuring the intensity of the pressure for touch, and/or a detection panel. The detection panel may detect an indication position using a peripheral device such as a position indicator (or a stylus-pen).

The audio module 170 may bi-directionally convert sound and electrical signals. According to one embodiment, the audio module 170 may acquire sound through the input device 150 or may output sound through the sound output device 155 or an external electronic device (e.g., electronic device 102 (e.g., a speaker or a headphone)) connected with the electronic device 101 in a wired or wireless manner.

The sensor module 176 may generate an electrical signal or a data value corresponding to an internal operating state (e.g., power or temperature) of the electronic device 101 or an external environmental condition. The sensor module 176 may include, for example, a gesture sensor, a gyro sensor, an atmospheric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support a designated protocol that can be connected to an external electronic device (e.g., electronic device 102) in a wired or wireless manner According to one embodiment, the interface 177 may include a high definition multimedia interface (HDMI), a universal serial bus (USB) interface, an SD card interface, or an audio interface.

The connection terminal 178 may include a connector capable of physically connecting the electronic device 101 and an external electronic device (e.g., electronic device 102), for example, an HDMI connector, a USB connector, an SD card connector, or an audio connector (e.g., a headphone connector).

The haptic module 179 may convert an electrical signal into a mechanical stimulus (e.g., vibration or motion) or an electrical stimulus enabling the user to perceive through a tactile or kinesthetic sense. The haptic module 179 may include, for example, a motor, a piezoelectric element, or an electrical stimulation device.

The camera module 180 may capture a still image or moving image. According to one embodiment, the camera module 180 may include one or more lenses, an image sensor, an image signal processor, or a flash.

The power management module 188 is a module for managing the power supplied to the electronic device 101 and, for example, may be configured as a part of a power management integrated circuit (PMIC).

The battery 189 is a device for supplying power to at least one component of the electronic device 101 and, for example, may include a non-rechargeable primary cell, a rechargeable secondary cell, or a fuel cell.

The communication module 190 may establish a wired or wireless communication channel between the electronic device 101 and the external electronic device (e.g., electronic device 102, electronic device 104, or server 108) and support communication through the established communication channel. The communication module 190 may include at least one communication processor that independently operates from the processor 120 (e.g., an application processor) and supports wired or wireless communication. According to one embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a powerline communication module). The communication module 190, by using a corresponding communication module among the communication modules, may communicate with an external electronic device through the first network 198 (e.g., a short-range communication network such as a Bluetooth, a Wi-Fi direct, or an infrared data association (IrDA)) or through the second network 199 (e.g., a long-distance communication network such as a cellular network, the Internet, or a computer network (e.g., LAN or WAN)). The above mentioned various type communication modules 190 may be implemented by a single chip or by separate chips, respectively.

According to one embodiment, the wireless communication module 192 may identify and authenticate the electronic device 101 in the communication network by using user information stored in the subscriber identification module 196.

The antenna module 197 may include one or more antennas for transmitting or receiving signals or power to or from the outside. According to one embodiment, the communication module 190 (e.g., wireless communication module 192) may transmit or receive signals to or from an external electronic device via antenna suitable for the communication scheme thereof.

Some components among the above mentioned components may be connected to each other via a communication scheme between the peripheral device (e.g., a bus, a general-purpose input/output (GPIO), a serial peripheral interface (SPI), or a mobile industry processor interface (MIPI)), so as to exchange signals (e.g., instructions or data) with each other.

According to one embodiment, instructions or data may be transmitted or received between the electronic device 101 and the external electronic device 104 via the server 108 connected to a second network 199. Each of the electronic devices 102 and 104 may be of a type, which is identical to or different from the electronic device 101. According to one embodiment, all or some of the operations executed in the electronic device 101 may be executed in another external electronic device or in multiple external electronic devices. According to one embodiment, in the case where the electronic device 101 should perform a certain function or service automatically or by a request, the electronic device 101 may request an external electronic device to provide at least some functions, which are associated with the function, instead of, or in addition to, executing the functions or service by itself. The external electronic device, which has received the request, may execute the requested functions or additional functions, and may transmit the results to the electronic device 101. The electronic device 101 may provide the requested functions or services by processing the received results as they are or additionally. For this purpose, for example, a cloud computing technique, a distributed computing technique, or a client-server computing technique may be used.

The electronic device according to various embodiments of the disclosure may be one of various types of devices. The electronic device, for example, may include at least one among portable communication devices (e.g., smartphones), computer devices, portable multimedia devices, portable medical instruments, cameras, wearable devices, or home appliances. However, the electronic device according to one embodiment of the disclosure is not limited to the above-mentioned devices.

In the description, the term "module" may include a unit that is configured in hardware, software, or firmware and, for example, may be used interchangeably with the "logic", "logical block", "circuit", or the like. A module may be an integrated component, a minimum unit which performs at least one function, or a part of the integrated component or the minimum unit. For example, a module may be configured in the form of an application-specific integrated circuit (ASIC).

Various embodiments of the disclosure may be implemented in software (e.g., programs 140) including instructions stored in a machine-readable storage medium (e.g., internal memory 136 or external memory 138) readable by a machine (e.g., a computer). The machine may be a device that calls the stored instructions from a storage medium and can operate according to the called instructions, and may include an electronic (e.g., electronic device 101) according to the disclosed embodiments. When the instructions are executed by a processor (e.g., processor 120), the processor may execute, directly or by using other components, functions corresponding to the instructions under the control of the processor. The instructions may include a code generated or executed by a compiler or an interpreter. The machine-readable storage medium may be provided in the form of a non-transitory storage medium. Here, "non-transitory" means that the storage medium does not include a signal and is tangible, but does not distinguish whether data is stored semi-permanently or temporarily in the storage medium.

According to one embodiment, the method according to various embodiments disclosed herein may be provided as a computer program product. A computer program product may be traded between a seller and a purchaser as a commodity. A computer program product may be distributed in the form of a machine-readable storage medium (e.g., a compact disc read only memory (CD-ROM)) or be distributed online through an application store (e.g., PlayStore™). For on-line distribution, at least a portion of the computer program product may be temporarily stored or temporarily created in a storage medium such as a memory of a manufacturer's server, an application store's server, or a relay server.

Each of the components (e.g., modules or programs) according to various embodiments may include one or more elements. Some sub-components among the corresponding sub-components described above may be omitted, or other sub-components maybe further added in the various embodiments. Alternatively or additionally, some components (e.g., modules or programs) may be integrated as a single entity so as to perform the functions performed by each of corresponding components prior to integration in a similar or same manner. Operations performed by a module, a programming module, or other components according to various embodiments may be executed sequentially, in parallel, repeatedly, or heuristically. In addition, at least some operations may be executed according to another sequence, may be omitted, or may further include other operations.

Hereinafter, a rectangular coordinate system may be used in order to explain embodiments of the disclosure. In a rectangular coordinate system, an x-axis may mean the width direction of an electronic device, a y-axis may mean a lengthwise direction of the electronic device, and a z-axis may mean a thickness direction of the electronic device. However, an x-axis, a y-axis, and a z-axis may be not limited to three axes on a rectangular coordinate system and may be construed as broader meaning including the same. For example, an x-axis, a y-axis, and a z-axis may be orthogonal to each other, but may refer to different directions not orthogonal to each other.

Figure 2:
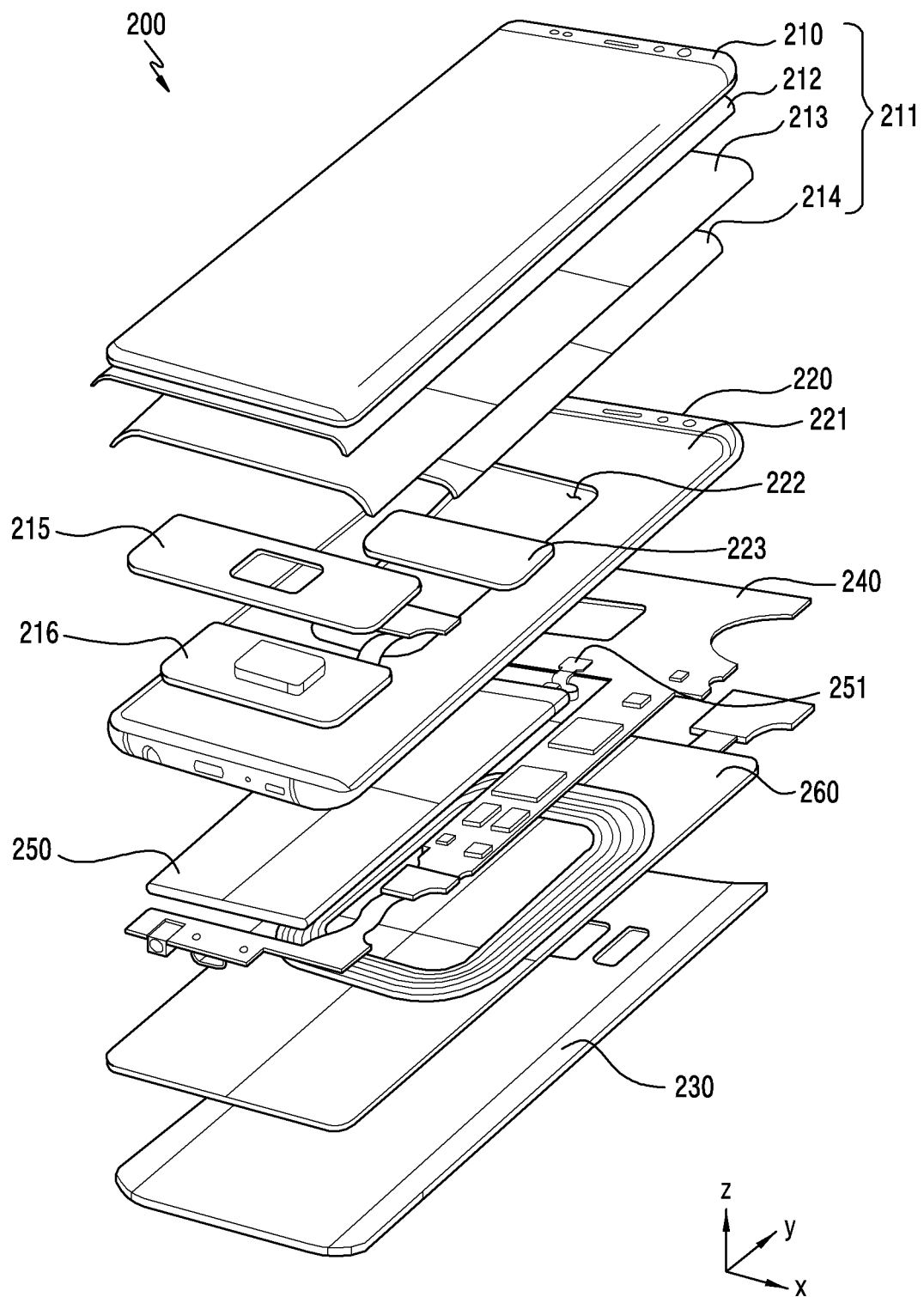
FIG. 2 is an exploded perspective view of an electronic device including an FPCB according to various embodiments of the disclosure.

FIG. 2 is an exploded perspective view of an electronic device including an FPCB according to various embodiments of the disclosure.

Referring to FIG. 2, an electronic device 200 according to one embodiment may include a housing forming the appearance of the electronic device 200. The housing may include a front housing 210 (or transparent cover), a side housing 220, and a rear housing 230. The rear housing 230 may face away from the front housing 210. The side housing 220 may be formed to surround a space between the front housing 210 and the rear housing 230. The front housing 210, the side housing 220, and/or the rear housing 230 may have appropriate shapes according to design reasons reflecting the appearances and/or functions thereof, and may be formed integrally with each other or assembled together after being separately formed.

According to one embodiment, the electronic device 200 (e.g., electronic device 101) may include a plurality of panels interposed between the front housing 210 and the rear housing 230. According to one embodiment, the plurality of panels 211 may include a touch panel 212, a display panel 213, a conductive shield panel 214, a pressure sensor panel 215, or a fingerprint sensor 216. Each of the plurality of panels 211 may be sequentially laminated on (or attached to) the lower portion of the front housing 210. Therefore, the set of multiple panels including the front housing 210 and the display panel 213 may be referred to as a single display device, a single display panel, or a single display module.

According to some embodiment, each of the panels may be disposed to be overlapped with only a portion of the front housing 210 in order to reduce thickness of the electronic device 200. For example, at least a part of the pressure sensor panel 215 may be disposed substantially flush with the conductive shield panel 214.

The side housing 220 may include a support member 221 integrally formed therein or formed by a separate member coupled thereto. The support member 221 may have a front surface to which the front housing 210 is coupled and a rear surface to which a printed circuit board 240 is coupled. The printed circuit board 240 may have a processor, a power management module, a memory, and/or an interface mounted (or disposed) thereon. The processor may include, for example, one or more of a central processing unit, an application processor, a graphics processing unit, an image signal processor, a sensor hub processor, or a communication processor. The memory may include, for example, a volatile memory or a nonvolatile memory. The interface may include, for example, a high-definition multimedia interface (HDMI), a universal serial bus (USB) interface, an SD card interface, or an audio interface. The interface, for example, may electrically or physically connect the electronic device 200 to an external connect and include a USB connector, an SD card/MMC connector, or an audio connector. Accordingly, the side housing 220 may be referred to as a support member or a bracket.

A battery 250 is a device for supplying power to at least one element of the electronic device 200 and may include, for example, a non-rechargeable primary cell, a rechargeable secondary cell, or a fuel cell. At least a part of the battery 250, for example, may be disposed substantially flush with the printed circuit board 240. The battery 250 may be integrally disposed inside the electronic device 200 or detachably disposed with the electronic device 200. According to one embodiment, the electronic device 200 may include an opening 222 (or, housing slit) formed through at least a partial area of the support member 221. The opening 222 may be used as a space capable of compensating for a swelling phenomenon of the battery 250.

According to one embodiment, a flexible printed circuit board 251 (hereinafter, FPCB) (or second printed circuit board) may connect the battery 250 and the printed circuit board 240 (or first printed circuit board). The FPCB 251 may include one end connected to the battery 250 and another end in contact with the printed circuit board. The FPCB 251 may include a cushioning structure (or cushioning part) between the one end and another end. The cushioning structure may cushion an external impact capable of being generated by an external impact applied to the electronic device so as to prevent damage such as cracking of the FPCB 251. The cushioning structure included in the FPCB 251 will be specifically described below.

Antenna 260 may be disposed between the rear housing 230 and the battery 250. The antenna 260 may include, for example, a near field communication (NFC) antenna, a wireless charging antenna, and/or a magnetic secure transmission (MST) antenna. The antenna 260, for example, may communicate with an external device in a near field communication, transmit or receive, in a wireless, power necessary for charging. In another embodiment, antenna emitter may be further included in a part of the side housing 220 and/or the support member 221 to form the antenna structure together with the antenna 260. According to one embodiment, the side housing may include a conductor 223 covering at least a part of the opening 222 of the support member 221. The conductor 223 may shift a parasitic resonance frequency capable of being generated from the opening 222 into an out band so as to prevent performance reduction of the antenna.

Figure 3:
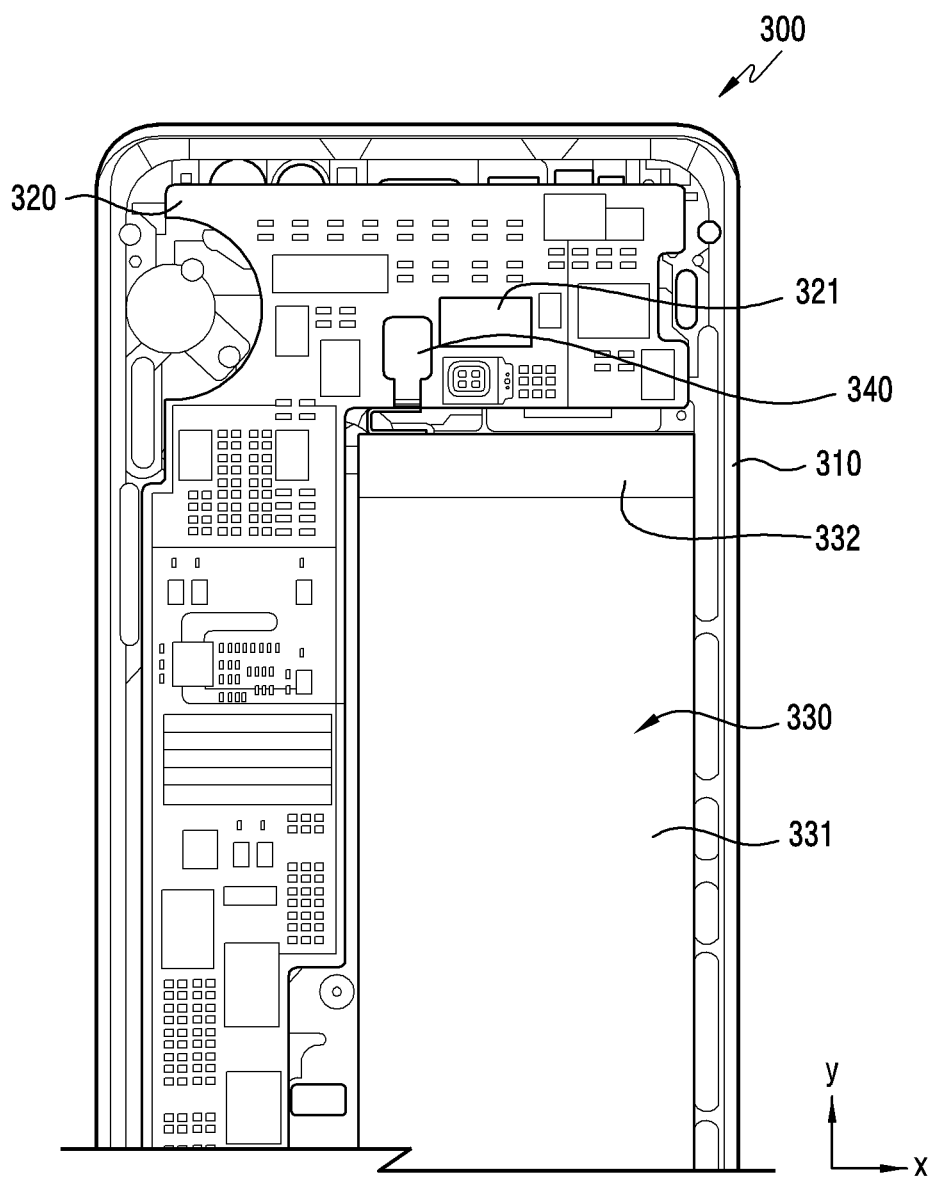
FIG. 3 is a plan view for showing the inside of an electronic device including an FPCB according to one embodiment of the disclosure.

FIG. 3 is a plan view for showing the inside of an electronic device including an FPCB according to one embodiment of the disclosure. In FIG. 3, the electronic devices 101 and 200 illustrated in FIG. 1 and FIG. 2 and elements at least some similar to or identical to elements included therein may be explained and a repeated explanation will be omitted.

Referring to FIG. 3, an electronic device 300 may include a printed circuit board 320 and a battery 330 mounted in a housing 310. The housing 310 may be configured by an integrated combination of one or at least two among a front housing (e.g., front housing 210 of FIG. 2) forming the appearance of the electronic device 300, a side housing (e.g., side housing 220 of FIG. 2), or a rear housing (e.g., rear housing 230 of FIG. 2).

According to one embodiment, the printed circuit board 320 and the battery 330 may be disposed on the substantially same plane (e.g., x-y plane) while occupying a predetermined portions of the space in the housing 310, respectively. Various electronic components such as a power management module 321 (e.g., power management module 188 of FIG. 1) may be mounted on one surface of the printed circuit board 320. The battery 330, for supplying and charging power, may be connected to the printed circuit board 320 through an FPCB 340. That is, the battery 330, through the FPCB 340 connecting the battery 330 and the printed circuit board 320 according to embodiments of the disclosure, may be electrically or operatively connected to the power management module 321.

The power management module 321 may include a charging circuit, a power regulator, or a fuel gauge. The charging circuit may charge the battery 330 by using power supplied from an external power source for the electronic device 300. According to one embodiment, the charging circuit may select a charging scheme (e.g., normal charging or quick charging) based on at least a part of a type of the external power source (e.g., power adapter, USB, or wireless charging), magnitude of power capable of being supplied from the external power source (e.g., about 20 Watt or more), or an attribute of the battery 330, and may charge the battery 330 by using the selected charging scheme. The external power source, for example, may be connected wired through a connection terminal (e.g., connection terminal 178 of FIG. 1) or wirelessly through antenna module (e.g., antenna module 197 of FIG. 1).

The power regulator may generate multiple powers having different voltage levels or different current levels by adjusting a voltage level or a current level of the power supplied from the external power source or the battery 330. The fuel gauge may measure use state information about the battery 330 (e.g., capacity, the number of times of charges or discharges, a voltage, or a temperature of the battery).

The power management module 321 may determine, using, for example, the charging circuit, a voltage regulator, or the fuel gauge, charging state information (e.g., lifetime, over voltage, low voltage, over current, over charge, over discharge, overheat, short, or swelling) related to the charging of the battery 330 based on at least a part of the measured use state information, and may determine whether the state of the battery 330 is normal or abnormal based on at least a part of the determined charging state information. If the state of the battery 330 is determined to abnormal, the power management module may adjust the charging of the battery 330 (e.g., reduce the charging current or voltage, or stop the charging). According to one embodiment, at least some among the functions of the power management module 330 may be performed by an external control device (e.g., the processor 120 of FIG. 1).

The battery 330, according to one embodiment, may include a battery cell 331 and a protection circuit module 332 (hereinafter, PCM) of the battery. The battery cell 331 may include a negative electrode plate, a positive electrode plate, and a separator for separating the negative electrode plate and the positive electrode plate, and have the form of a pouch filled with an electrolyte therein. The battery cell 331 may charge or discharge electricity by using the electric charge moving through the electrolyte. The PCM 332 may perform various functions (e.g., a pre-cutoff function) to prevent performance degradation or damage by a fire of the battery 330. The PCM 332, additionally or generally, may be configured as at least a part of a battery management system (BMS) for performing cell balancing, measurement of battery capacity, measurement of the number of times of charges or discharges, measurement of temperature, or measurement of voltage.

Figure 4:
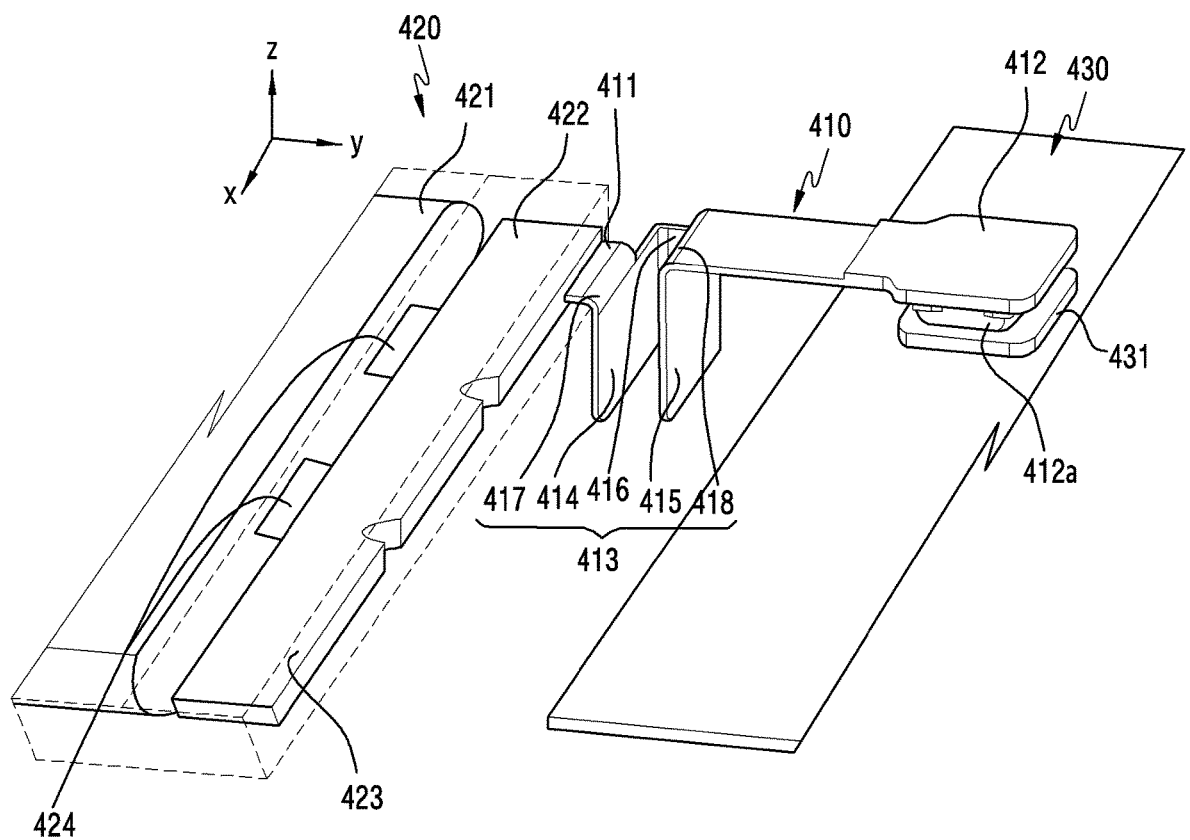
FIG. 4 is a perspective view of a battery and an FPCB connected to the battery according to one embodiment of the disclosure.

FIG. 4 is a perspective view of a battery and an FPCB connected to the battery according to one embodiment of the disclosure. In FIG. 4, the batteries 189, 250, and 330 illustrated FIG. 1 to FIG. 3 and elements at least some similar to or identical to the FPCBs 251 and 340 may be explained and a repeated explanation will be omitted.

Referring to FIG. 4, an FPCB 410 may electrically or operatively connect a battery 420 and a printed circuit board 430 with each other. A first end portion 411 of the FPCB 410 may be connected to the battery 420 and a second end portion 412 thereof may be connected to the printed circuit board 430.

According to one embodiment, each of a connection of the first end portion 411 and the battery 420 and a connection between the second end portion 412 and the printed circuit board 430 may be fixedly coupled or detachably coupled. For example, one end portion of the FPCB 410 may include an insert part or a receptacle part of a connector, and the battery 420 or the printed circuit board 430 may include a receptacle part or an insert part of a connector corresponding to the one end portion, whereby each of the insert parts and each of the receptacle parts may be connected to each other, so that the FPCB 410 and the battery 420 or the FPCB and the printed circuit board 430 are detachably connected to each other. As illustrated therein, the second end portion 412 may include an insert part 412a and the printed circuit board 430 may include a receptacle part 431 corresponding to the insert part, whereby the second end portion and the printed circuit board may be connected to each other. For another example, one end portion of the FPCB 410, using an appropriate method such as an adhesive, a laser, or an ultrasonic welding, may be physically and fixedly coupled to the battery 420 or the printed circuit board 430, and a circuit pattern (or trace) of the FPCB 410 and the battery 420 or the circuit pattern (or trace) of the FPCB and the printed circuit board 430 may be electrically connected to each other through a soldering or a wiring, whereby the FPCB 410 and the battery 420 or the FPCB and the printed circuit board 430 may be connected. In the embodiment and another embodiment throughout this document, when the FPCB 410 is connected to the battery 420 and the printed circuit board 430, it may mean that the above mentioned coupling examples have been applied.

According to one embodiment, the battery 420 may include a battery cell 421 and a protective circuit module 423 (hereinafter, PCM) which is electrically connected to conductive terminals 424 withdrawn from the battery cell 421. The PCM 423 may be enclosed by a protective case 422 which protects the PCM 423 from an external impact. According to some embodiment, the protective case 422 may be coupled to the battery cell 421 while enclosing only the PCM 423. In another embodiment, the protective case 422 may have an appropriate shape capable of enclosing the PCM 423 and the battery cell 421 together. In one embodiment, a first end portion 411 of the FPCB 410 may be connected to the PCM 423. In another embodiment, the FPCB 410 may be integrally formed with a circuit board of the PCM 423. In another embodiment, in a case where the battery 420 does not include the PCM 423, the FPCB 410 may be directly connected to the battery cell 421. In this case, the PCM 423 may be formed on the printed circuit board 430 or the FPCB 410.

According to embodiments of the disclosure, the FPCB 410 may include a cushioning part 413 interposed between the first end portion 411 and the second end portion 412. An external impact to an electronic device (e.g., electronic device 200 of FIG. 2) including the FPCB 410 may cause a direct impact to the FPCB 410. Furthermore, when a battery 420 and/or printed circuit board 430 fixed within an electronic device moves (locomotion) due to an external impact to the electronic device, an indirect impact may be applied to the FPCB 410 connecting the battery and the printed circuit board. The cushioning part 413 can cushion an impact applied from all directions, so as to prevent damages of the FPCB 410 by the impact. Hereinafter, a structural feature of the cushioning part 413 for another embodiment will be described.

The cushioning part 413 may include a first flat surface part 414, a second flat surface part 415, and a connection part 416. The first flat surface part 414 may extend from the first end portion 411 toward the second end portion 412. The first end portion 411 may be bent to include the first flat surface part 414 parallel to a second plane (x-z plane) substantially perpendicular to a first plane (x-y plane) to which the first end portion 411 is parallel. The portion having a bent shape at a boundary between the first end portion 411 and the first flat surface part 414 may be referred to as a first bent part 417. In addition, the second flat surface part 415 may extend from the second end portion 412 toward the first end portion 411. The second end portion 412 may be bent to include the second flat surface part 415 parallel to the second plane substantially perpendicular to a first plane to which the second end portion 412 is parallel. The portion having a bent shape at a boundary between the second end portion 412 and the second flat surface part 415 may be referred to as a second bent part 418. Therefore, the first flat surface part 414 and the second flat surface part 415 may face away from each other. The space between the first flat surface part 414 and the second flat surface part 415 may be connected by the connection part 416.

The connection part 416 may extend from each of the first flat surface part 414 and the second flat surface part 415 toward a third plane (y-z plane) substantially perpendicular to all of the first plane and the second plane, and then be bent to connect the first flat surface part 414 and the second flat surface part 415. Therefore, the connection part 416 may be referred to as a third bent part or a curved part. In other words, the connection part 416 may be a portion connecting the first flat surface part 414 and the second flat surface part 415 from a side surface (the third plane). Expressed differently, the connection part 416 may have a "U" (or "⊏") shape.

As described above, the FPCB 410 according to an embodiment of the disclosure can cushion an impact applied from all directions by an external impact. For example, the first bent part 417 and/or the second bent part 418 can absorb an impact from the lengthwise direction thereof (y-axis direction) and the thickness direction thereof (z-axis direction) through the changing of a bending curvature, or the like. Furthermore, the connection part 416 (or third bent part) can absorb an impact from the lengthwise direction thereof (y-axis direction) and the width direction thereof (x-axis direction) through the changing of a bending curvature, or the like. Therefore, according to an embodiment of the disclosure, the cushioning part 413 of the FPCB 410 may have a relatively small size, and thus enables an impact applied from all directions to be cushioned.

Figure 5:
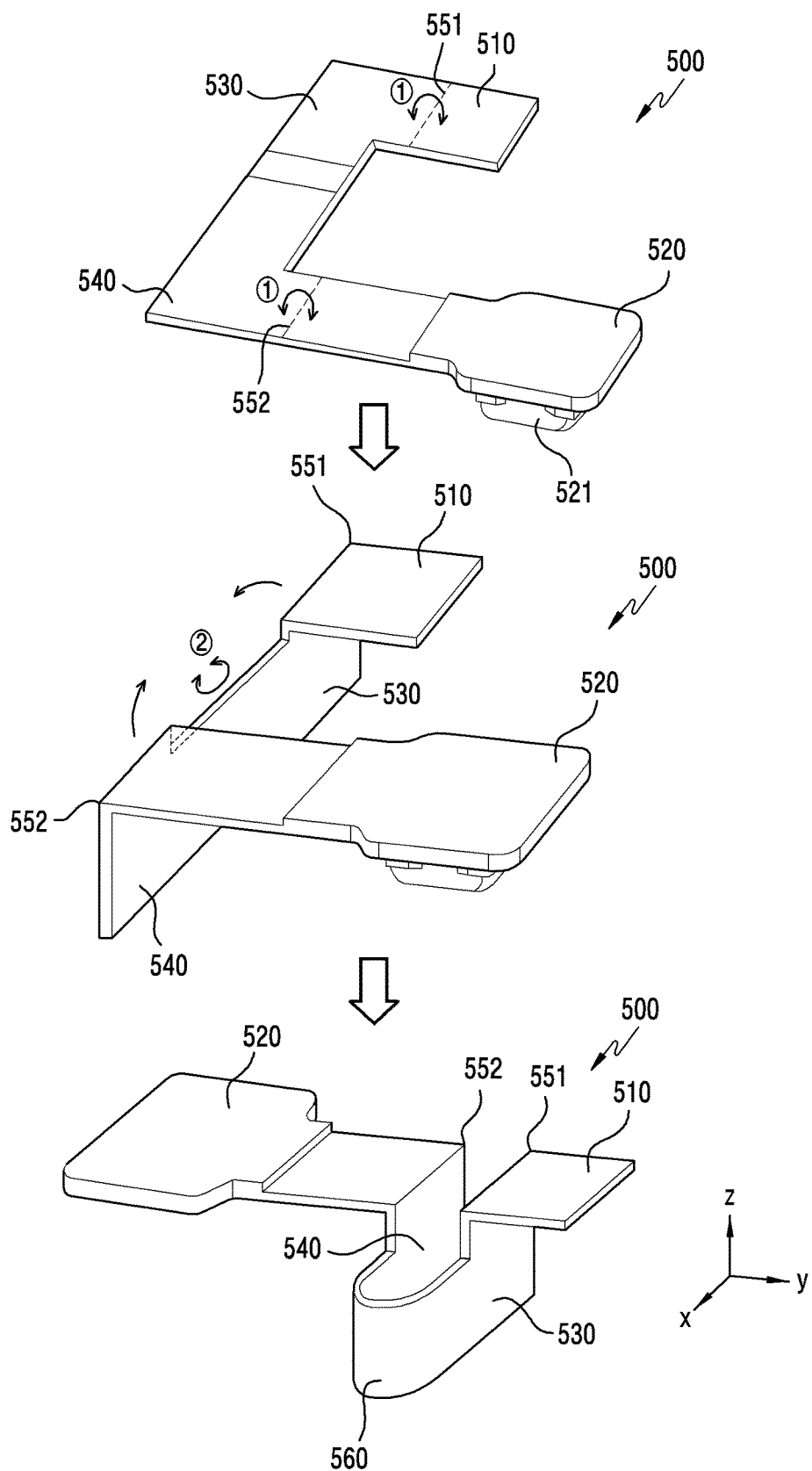
FIG. 5 to FIG. 7 illustrate manufacturing processes of FPCBs according to various embodiments of the disclosure.
Figure 6:
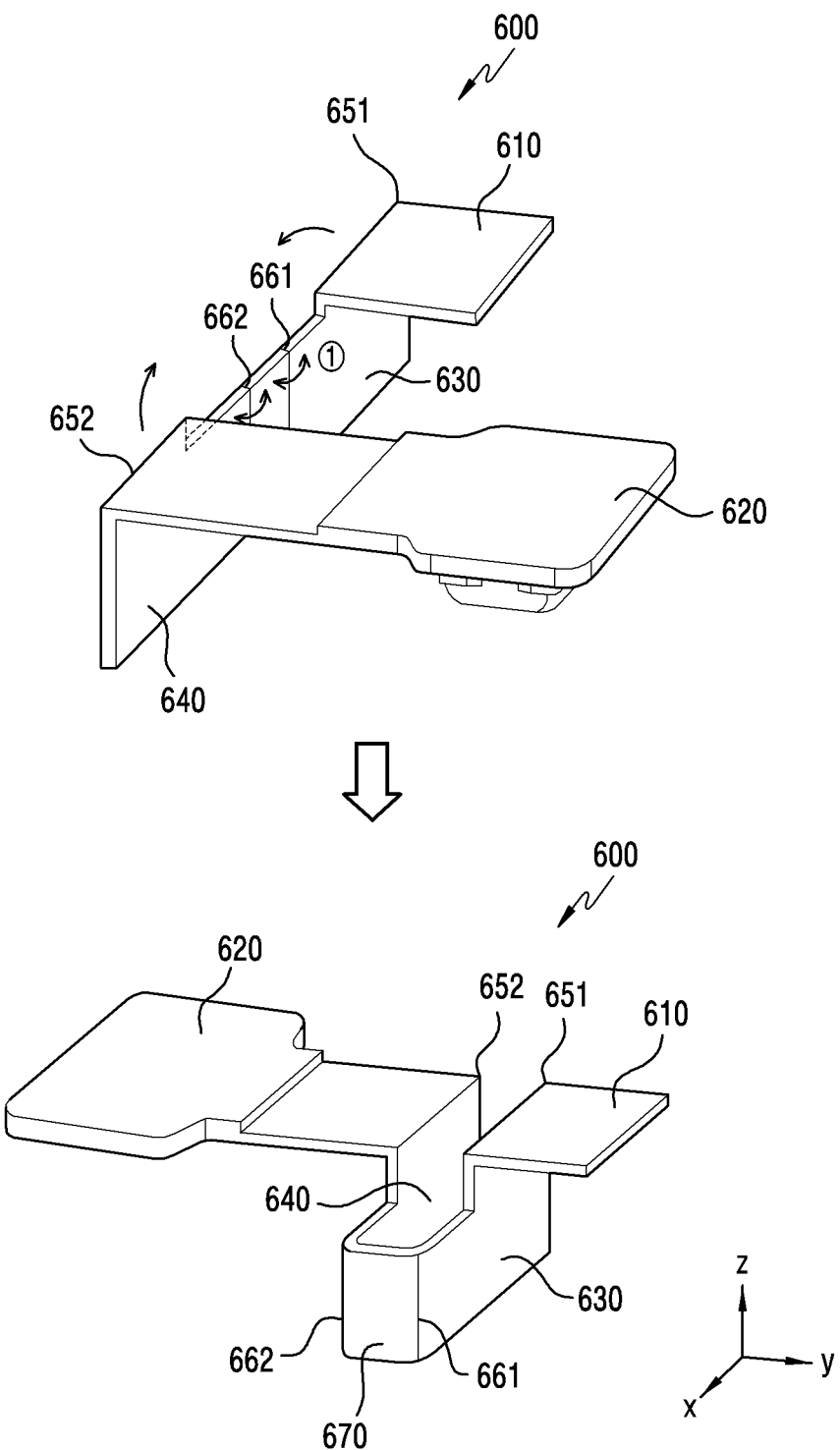
Figure 7:
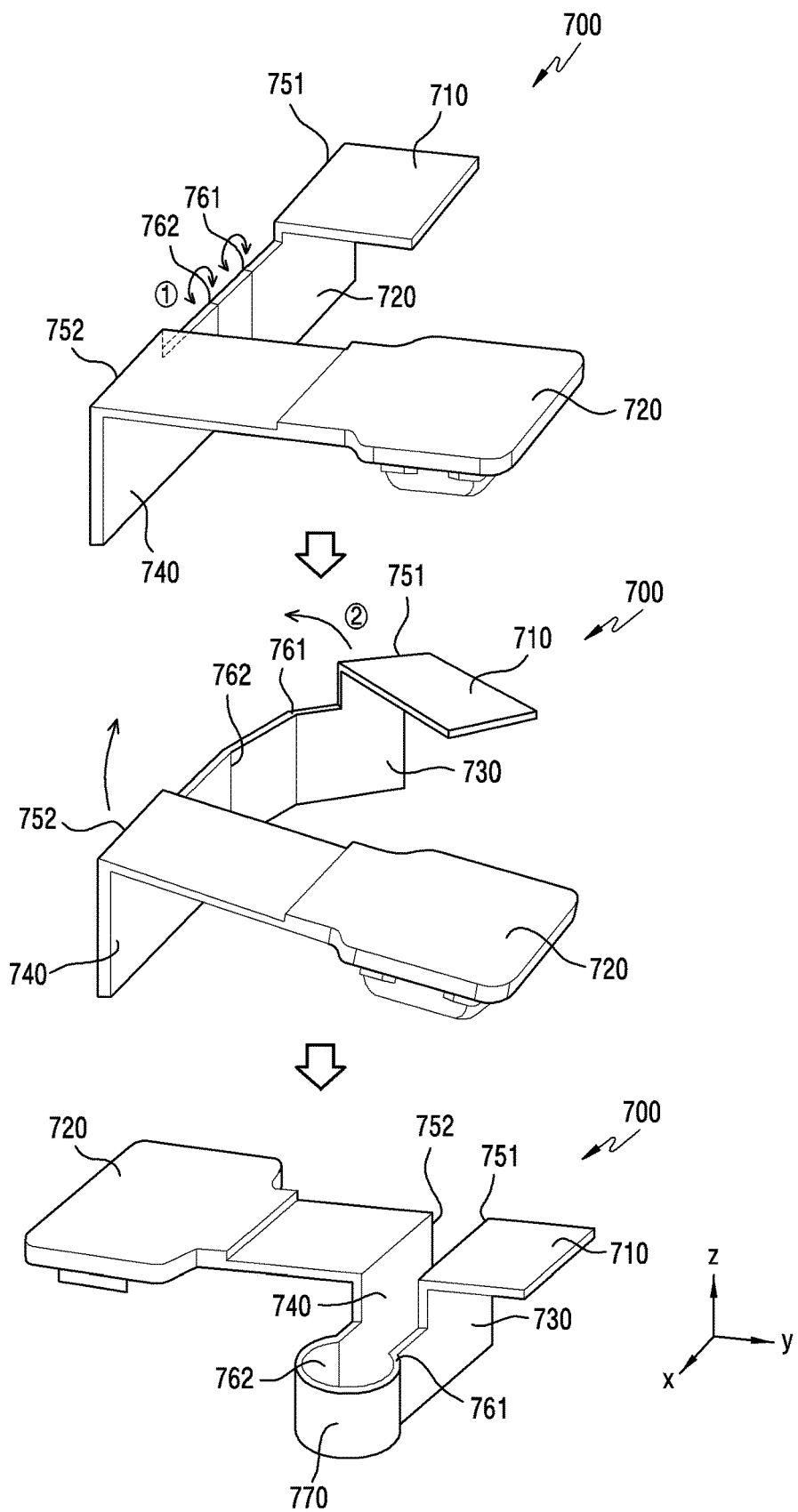

FIG. 5 to FIG. 7 illustrate manufacturing processes of FPCBs according to various embodiments of the disclosure. With reference to FIGS. 5 to 7, embodiments of FPCBs capable of having connection parts of various shapes according to forming methods will be described. FPCBs to be explained with reference to FIGS. 5 to 7 may be at least some similar to or identical to the FPCB 410 illustrated in FIG. 4.

Firstly referring to FIG. 5, an FPCB 500 (e.g., 410 in FIG. 4) according to one embodiment may be formed by bending a flat type FPCB through a bending process or folding the same. For example, the FPCB 500 may include a first end portion 510, a second end portion 520, a first flat surface part 530, and a second flat surface part 540 which are on one plane (x-y plane). The first flat surface part 530 and the second flat surface part 540 may connect the first end portion 510 and the second end portion 520 which are positioned to be parallel. The FPCB 500 may be formed as a single piece with the first and second end portions 510 and 520 and the flat surface parts 530 and 540.

Firstly, the first end portion 510 may be bent (in the direction of arrow ①) to include the first flat surface part 530 substantially perpendicular to the first end portion 510 at a boundary portion 551. In addition, the second end portion 520 may be bent (in the direction of arrow ①) to include the flat surface part 540 substantially perpendicular to the second end portion 520 at a boundary portion 552. The boundary portion between the first end portion 510 and the first flat surface part 530 may be referred to as a first bent part 551, and the boundary portion between the second end portion 520 and the second flat surface part 540 may be referred to as a second bent part 552. In other words, the first end portion 510 and the first flat surface part 530 may be bent at the first bent part 551, and the second end portion 520 and the second flat surface part 540 may be bent at the second bent part 552. For example, the first bent part 551 and the second bent part 552 may be bent by a bending process using a jig. Bent parts to be explained below may be formed by a folding process or a bending process, a folding and a bending having a similar meaning may be mixedly used.

Nextly, the first flat surface part 530 and the second flat surface part 540 may be bent (in the direction of arrow ②) to face away from each other. Therefore, the portion between the first flat surface part 530 and the second flat surface part 540 may be referred to as a connection part 560. In other words, the connection part 560 may be stepped to include the first flat surface part 530 and the second flat surface part 540.

Referring to FIG. 6, an FPCB 600 (e.g., 410 in FIG. 4) according to another embodiment may be bent to have a connection part 670 in a state of including a first bent part 651 and a second bent part 652. A first flat surface part 630 and a second flat surface part 640 may be bent (in the direction of arrow ①) to face with each other at two points 661 and 662 at which the first flat surface part and the second flat surface part are spaced a predetermined distance apart from each other. In other words, the first flat surface part 630 may be substantially perpendicular to the connection part 670 at a boundary 661 with the connection 670, and also the second flat surface part 640 may be substantially perpendicular to the connection part 670 at a boundary 662 with the connection 670. That is, compared with the FPCB 500 according to the embodiment illustrated in FIG. 5, the FPCB 600 according to the embodiment may include the connection part 670 having angled shape.

Referring to FIG. 7, an FPCB 700 according to another embodiment may include a connection part 770 having the shape of a horseshoe. For example, a first flat surface part 730 and a second flat surface part 740 may be bent (in the direction of arrow ①) in a direction opposite to the direction facing with each other, at two points 761 and 762 at which the first flat surface part and the second flat surface part are spaced a predetermined distance apart from each other. Next, the first flat surface part 730 and the second flat surface part 740 may be bent (in the direction of arrow ②) to face with each other. Therefore, the connection part 770 may have the shape of a horseshoe. The connection part 770 having the shape of a horseshoe may have a more gradual curvature, so as to enhance the cushioning effect against an external impact and reduce the shear stress applied to a circuit wiring (or trace) included in the connection part 770.

Figure 8:
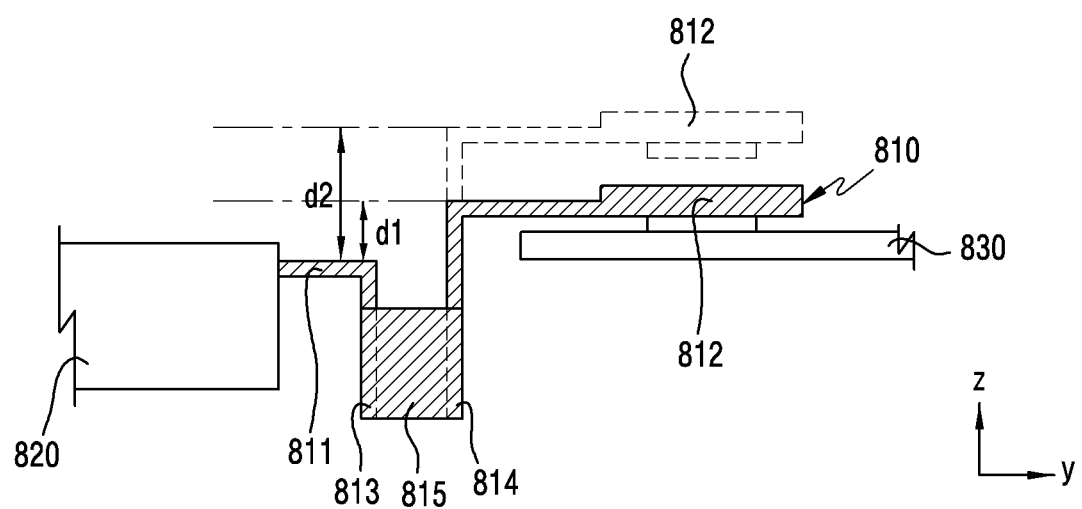
FIG. 8 is a side view of an FPCB according to one embodiment of the disclosure.

FIG. 8 is a side view of an FPCB according to one embodiment of the disclosure. Referring to FIG. 8, an FPCB 810 (e.g., 410 in FIG. 4) according to one embodiment may connect a battery 820 and a printed circuit board 830 which are positioned at different heights from each other.

The FPCB 810 may include: a first end portion 811; a second end portion 812; and the first flat surface part 813, a second flat surface part 814, and a connection part 815 which are interposed between the first and second end portions 811 and 812. The second flat surface part 814 according to one embodiment may have a length longer than that of the first flat surface part 813, so as to have a first length difference d1 in a thickness direction thereof (z-axis). Therefore, the first length difference d1 between the first and second flat surface parts 813 and 814 may compensate for a height difference between a height in which the first end portion 811 is connected to the battery 820 and a height in which the second end portion 812 is connected to the printed circuit board 830. According to another embodiment, the second flat surface part 814 may have a length longer than that of the first flat surface part 813, so as to have a second length difference d2 in a thickness direction thereof. According to the embodiments, the FPCB 810 may connect the battery 820 and the printed circuit board 830 which have various height differences, by adjusting the heights of the first flat surface part 813 and the second flat surface part 814. However, the embodiment is not limited thereby, and the first flat surface part 813 and the second flat surface part 814 may have the substantially same heights. For example, the first flat surface part 813 and the second flat surface part 814 may have the same heights, and the heights of the end portions 811 and 812 can be adjusted by changing curvature of each of bent parts interposed between the flat surface parts 813 and 814 and the end portions 811 and 812. For another example, the first flat surface part 813 and the second flat surface part 814 may have the same heights, and also the heights of the end portions 811 and 812 can be adjusted by tilting the connection 815.

Figure 9:
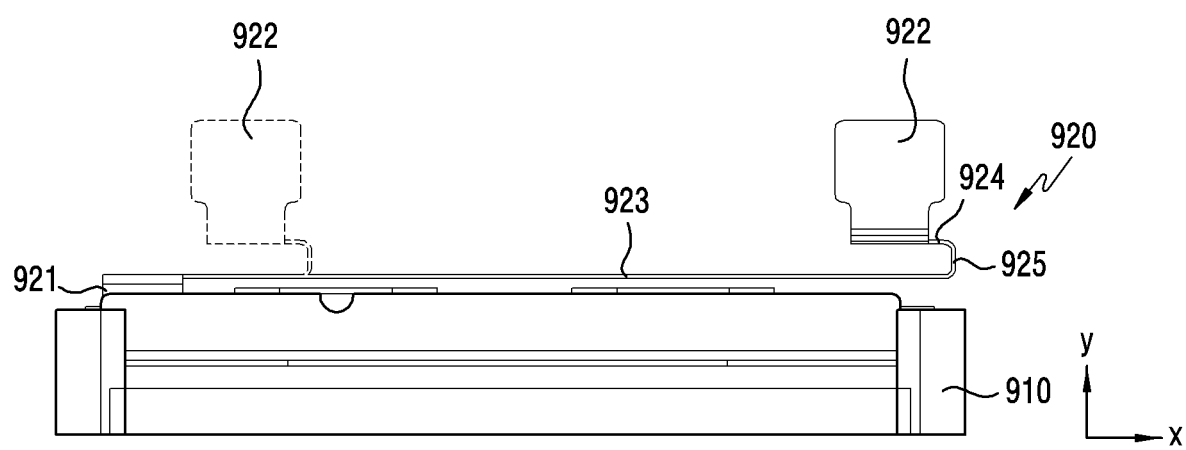
FIG. 9 is a plan view of an FPCB according to one embodiment of the disclosure.

FIG. 9 is a plan view of an FPCB according to one embodiment of the disclosure. Referring to FIG. 9, an FPCB 920 according to one embodiment can adjust the position of a second end portion 922.

The FPCB 920 may include: a first end portion 921 connected to a battery 910; a second end portion 922; and the first flat surface part 923, a second flat surface part 924, and a connection part 925 which are interposed between the first and second end portions 911 and 922. The first flat surface part 923 may have various lengths in the width direction thereof (x-axis). According to one embodiment, the first flat surface part 923 may have a length substantially corresponding to the width of the battery 910. In addition, in the other one embodiment, the first flat surface part 923 may have a length shorter than that of the battery 910. According to the embodiments, the second end portion 922 of the FPCB 920, through adjusting the length of the first flat surface part 923, may be connected to a corresponding member (e.g., printed circuit board 240 of FIG. 2) at various positions. However, the embodiment is not limited thereby, and the first flat surface part 923 and/or the second flat surface part 924 may have various lengths in the width direction thereof, so that the first end portion 921 and the second end portion 922 are positioned at various positions. Furthermore, in a case where the first end portion 921 is connected thereto from the side surface of the lengthwise direction of the battery 910, the first flat surface part 923 and the second flat surface part 924 may be meant to have various lengths in the lengthwise direction thereof.

Figure 10A:
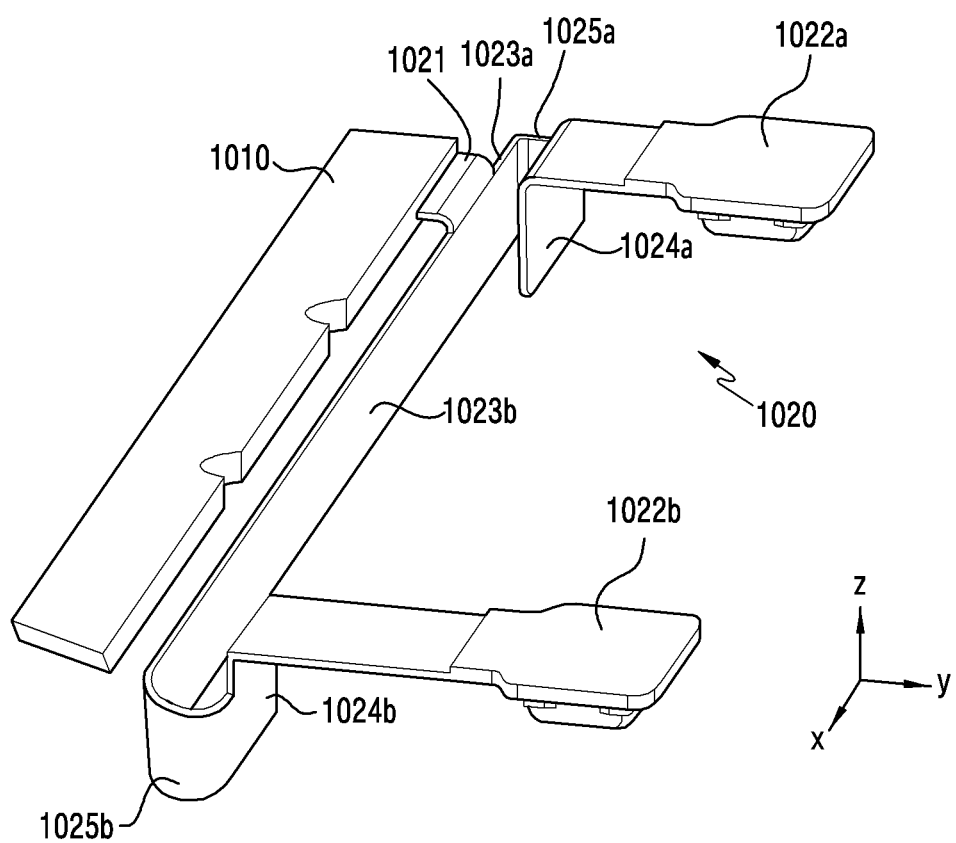
FIG. 10A is a perspective view of an FPCB 1020 according to one embodiment of the disclosure.
Figure 10B:
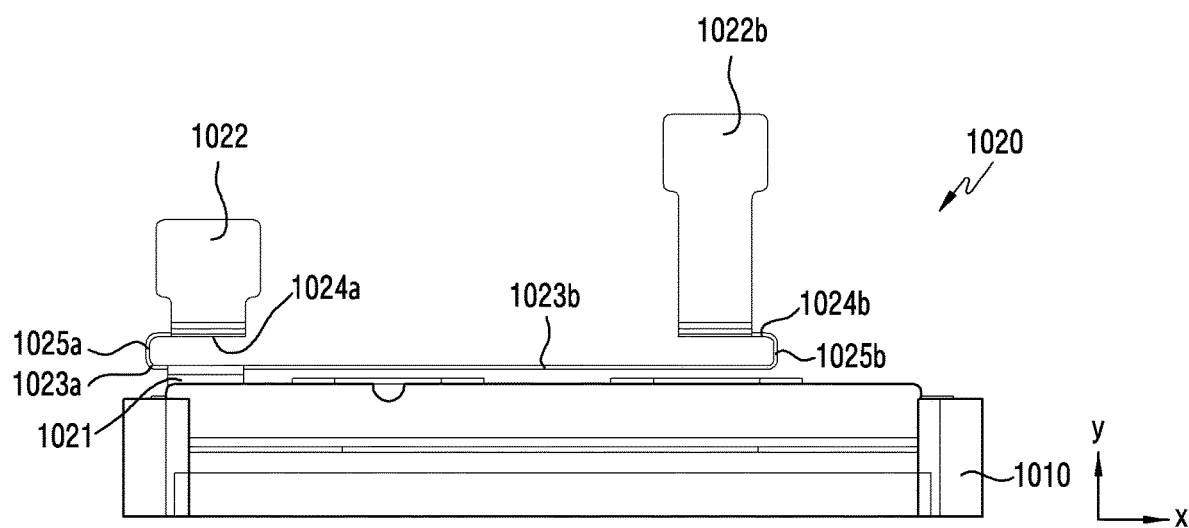
FIG. 10B is a plan view of the FPCB illustrated in FIG. 10A.

FIG. 10A is a perspective view of an FPCB 1020 according to one embodiment of the disclosure. FIG. 10B is a plan view of the FPCB illustrated in FIG. 10A. In accordance with the development of technology, a battery 1010 may be supplied with, through an FPCB 1020, power from at least two charging circuits. The at least two charging circuits can divide the current charged to the battery 1010, so as to reduce heat generation and shorten the time of charging. Therefore, the FPCB 1020 may need to have at least two paths for charging a current. For example, the FPCB 1020 may include an end portion connected to the battery 1010 and, in addition to, further include another end portions to be connected to the at least two charging circuit which are branched from the end portion.

Referring to FIGS. 10A and 10B, the FPCB 1020 according to one embodiment may include two second end portions 1022a and 1022b. A first end portion 1021 may be connected to the battery 1010.

The first end portion 1021, with reference to the first end portion 1021, may extend to include a left-first flat surface part 1023a and a right-first flat surface part 1023b. The first flat surface parts 1023a and 1023b may be bent to be substantially perpendicular to the first end portion 1021. Each of the first flat surface parts 1023a and 1023b, with reference to the first end portion 1021, may extend in opposite directions from each other along the width (x-axis) of the battery. For example, the left-first flat surface part 1023a, with reference to the first end portion 1021, may be directed toward the left (−x axis direction). The right-first flat surface part 1023b, with reference to the first end portion 1021, may be directed toward the right (+x axis direction).

The left-first flat surface part 1023a may be bent to include a left connection part 1025a and a left-second flat surface part 1024a. The second flat surface part 1024a may be bent to include a left-second end portion 1022a. The left-second end portion 1022a may be substantially parallel to the first end portion 1021 and be substantially perpendicular to the left flat surface parts 1023a and 1024a. Like as the left configurations, the right-first flat surface part 1023b may be bent to include a right connection part 1025b and a right-second flat surface part 1024b. The second flat surface part 1024b may be bent to include a right-second end portion 1022b. The right-second end portion 1022b may be substantially parallel to the first end portion 1021 and be substantially perpendicular to the right flat surface parts 1023b and 1024b.

Referring to FIG. 10B, the second end portions 1022a and 1022b according to the disclosure may be positioned at various positions. For example, the left-second end portion 1022a and the right-second end portion 1022b may have different lengths from each other in the lengthwise direction thereof (y-axis). In addition, the left-first flat surface part 1023a and the right-first flat surface part 1023b may have different lengths from each other in the width direction thereof (x-axis). Therefore, each of the left-second end portion 1022a and the right-second end portion 1022b may be connected to a corresponding member at various positions through by adjusting the lengths thereof and/or the lengths of the first flat surface parts 1023a and 1023b. However, the embodiment is not limited thereby, and the positions of the second end portions 1022a and 1022b may be adjusted through adjusting the lengths of the first end portion 1021 and/or the second flat surface parts 1024a and 1024b.

Figure 11:
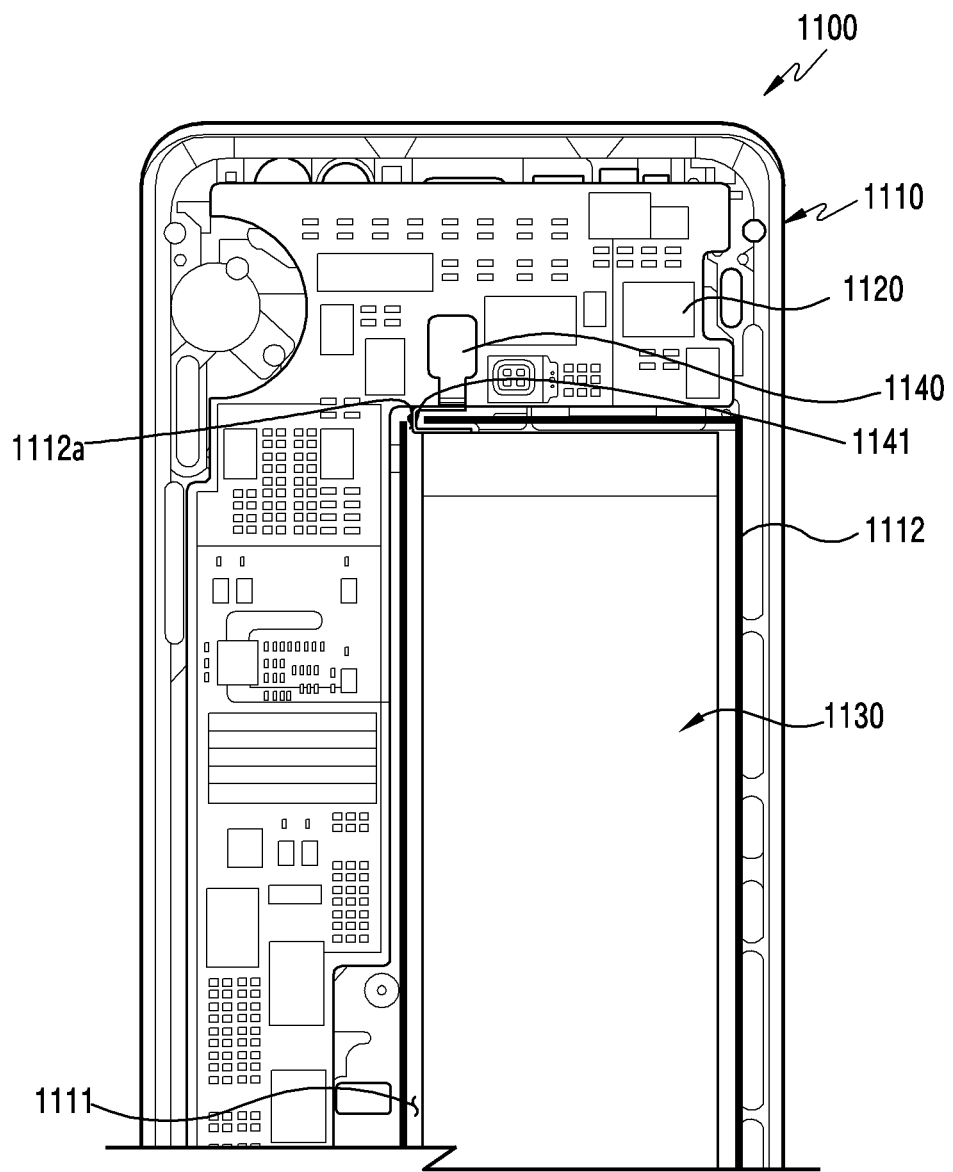
FIG. 11 is a plan view for showing the inside of an electronic device including an FPCB according to one embodiment of the disclosure.

FIG. 11 is a plan view for showing the inside of an electronic device including an FPCB according to one embodiment of the disclosure. Referring to FIG. 11, an electronic device 1100 may include a printed circuit board 1120 and a battery 1130 mounted in a housing 1110. The battery 1130, by using an FPCB 1140, may be electrically or operatively connected to the printed circuit board 1120. The housing 1110 may be configured by an integrated combination of one or at least two among a front housing (e.g., front housing 210 of FIG. 2) forming the appearance of the electronic device 1100, a side housing (e.g., side housing 220 of FIG. 2), or a rear housing (e.g., rear housing 230 of FIG. 2).

According to one embodiment, the housing 1110 may include a space 1111 for mounting a battery. The space 1111 may be implemented by a partition wall 1112 formed to surround at least a part of the side surfaces of the battery. The partition wall 1112 may be integrally formed with the housing 1110 or be separately formed, so as to be fixedly attached the housing 1110. For example, the partition wall 1112 may be formed on a rear plate (e.g., rear plate 230 of FIG. 2) constituting the housing 1110 or a support member (e.g., support member 221 of FIG. 2).

Figure 12:
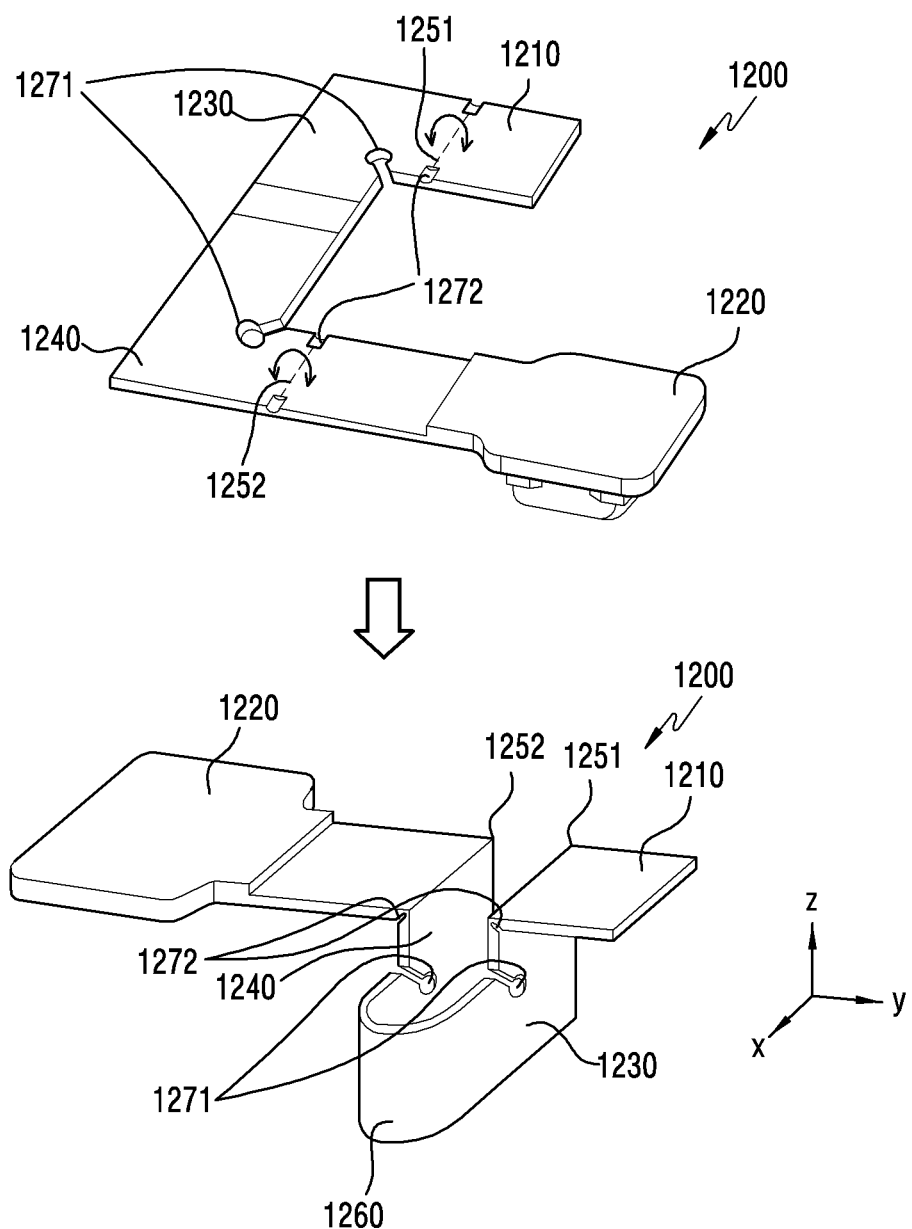
FIG. 12 illustrates a manufacturing process of an FPCB according to one embodiment of the disclosure.

The partition wall 1112 may include at least one opening 1112*a* (or slit). The opening 1112*a* may be configured to allow at least a part of the FPCB 1140 to extend therethrough. For example, a connection part 1141 of the FPCB 1140 may emerge from the partition 1112 through the opening 1112*a*. However, the embodiment is not limited thereby, and the connection part 1141 and also at least a part among elements of the FPCB 1140 may be configured to extend through the opening 1112*a* according to the FIG. 12 illustrates a manufacturing process of an FPCB according to one embodiment of the disclosure. Referring to FIG. 12, an FPCB 1200 according to various embodiments may include multiple grooves or slits formed along boundary lines for bending or folding the FPCB. The multiple grooves or slits can minimize a bending stress, which may be generated at the FPCB 1200, so as to prevent the occurrence of a tearing or a spring-back phenomenon that the FPCB is unbent or unfolded after being bent or folded.

According to one embodiment, the FPCB 1200 may include slits 1271 formed through the corners of areas which extend from flat surface parts 1230 and 1240 toward a connection part 1260. The slits 1271 can prevent a tearing which may be caused by forces (e.g., warping) applied to the flat surface parts 1230 and 1240 and a connection part 1260 in different directions. In some embodiment, the slits 1271 may be formed to include holes which are formed through the ends of the cut parts formed by cutting the corners. In another embodiment, the slits 1271 may include only an openings formed through areas including the corners.

According to one embodiment, the FPCB 1200 may include grooves 1272 formed on each of boundary lines 1251 and 1252, at which the flat surface parts 1230 and 1240 are bended or folded between the flat surface part 1230 and the end portion 1210 and between the flat surface part 1240 and the end portion 1220, respectively. For example, the groove 1272 may be formed across the first flat surface part 1230 and the first end portion 1210 with reference to the boundary line 1251. That is, a part of the groove 1272 may be formed on the first flat surface part 1230 and the other part thereof may be formed on the first end portion 1210. According to one embodiment, the grooves may be formed on both side surfaces of the FPCB 1200. The grooves 1272 may be formed on surfaces to be folded at the boundary lines 1251 and 1252. In addition, the grooves 1272 may be formed on only one side surface of the FPCB 1200 at the boundary lines 1251 and 1252, or formed on middle portions of the boundary lines 1251 and 1252 so as not to affect circuit wirings included in FPCB 1200.

In the embodiments, the slits 1271 or the grooves 1272 formed through or on the FPCB 1220 may be formed by removing a copper foil layer and/or a reinforcement material formed on the surface of the FPCB 1200. In addition, the slits 1271 or the grooves 1272 may be formed by removing the all FPCBs 1200 of the corresponding areas.

An electronic device according to one embodiment of the disclosure may include: a housing including a front plate and a rear plate facing away from the front plate; a first printed circuit board disposed between the front plate and the rear plate; an electronic component disposed between the front plate and the rear plate and disposed on a first plane which is substantially identical to the first printed circuit board; and a second printed circuit board connecting the electronic component to the first printed circuit board. The second printed circuit board may include: a first end portion which is portion parallel to the first plane and is connected to the electronic component; a second end portion which is parallel to the first end portion and is connected to the first printed circuit board; a first flat surface part which extends from the first end portion toward the second end portion and is parallel to a second plane substantially perpendicular to the first plane; a second flat surface part, which extends from the second end portion toward the first end portion, is parallel to the second plane, and faces away from the first flat surface part; and a connection part, which extends from each of the first flat surface part and the second flat surface part toward a third plane substantially perpendicular to the first plane and the second plane, and is bent so as to connect the first flat surface part and the second flat surface part.

In the electronic device according to one embodiment of the disclosure, the first flat surface part and the second flat surface part may have different heights so as to allow the first end portion and the second end portion to have different heights.

In the electronic device according to one embodiment of the disclosure, the first flat surface part and the second flat surface part may have different lengths.

In the electronic device according to one embodiment of the disclosure, the connection part: may include a first folded part which extends from the first flat surface part and is folded toward the second flat surface part, and a second folded part which extends from the second flat surface part and is folded toward the first flat surface part; and may be substantially perpendicular to the first flat surface part and the second flat surface part.

In the electronic device according to one embodiment of the disclosure, the connection part may include: a first folded part which extends from the first flat surface part and is folded toward a direction opposite to the second flat surface part; a second folded part which extends from the second flat surface part and is folded toward a direction opposite to the first flat surface part; and a bent part which is interposed between the first folded part and the second folded part and has a substantially circular shape.

The electronic device according to one embodiment of the disclosure may further include an opening formed through positions at which sides of the first flat surface part and/or the second flat surface part and the connection part meet each other.

In the electronic device according to one embodiment of the disclosure, the electronic device may include a mounting part for mounting the electronic component, and the mounting part may include a partition wall formed along the edge of the electronic component.

In the electronic device according to one embodiment of the disclosure, the partition may include a slit part positioned to allow at least a part of the connection part to extend therethrough.

In the electronic device according to one embodiment of the disclosure, the partition wall may be formed at the housing of the electronic device or is formed at a support member interposed between the front plate and the rear plate.

In the electronic device according to one embodiment of the disclosure, the electronic component may include a battery, and the second printed circuit board may electrically and/or operatively connect the battery and a power management module mounted on the first printed circuit board.

A flexible printed circuit according to one embodiment of the disclosure may include: a first end portion parallel to a first plane; a second end portion substantially parallel to the first plane; and a cushioning part interposed between the first end portion and the second end portion, wherein the cushioning part may include: a first flat surface part extending from the first end portion toward the second end portion; a first bent part interposed between the first end portion and the first flat surface part, and bent such that the first flat surface part is parallel to a second plane substantially perpendicular to the first plane; a second flat surface part extending from the second end portion toward the first end portion; a second bent part interposed between the second end portion and the second flat surface part, and bent such that the second flat surface part is parallel to the second plane; and a first connection part, which extends from each of the first flat surface part and the second flat surface part so as to be parallel to a third plane substantially perpendicular to the first plane and the second plane and is bent so as to connect the first flat surface part and the second flat surface part.

In the flexible printed circuit according to one embodiment of the disclosure, the first flat surface part and the second flat surface part may have different heights so as to allow the first end portion and the second end portion to have different heights.

In the flexible printed circuit according to one embodiment of the disclosure, the first flat surface part and the second flat surface part may have different lengths.

In the flexible printed circuit according to one embodiment of the disclosure, the first connection part: may include a first folded part which extends from the first flat surface part and is folded toward the second flat surface part, and a second folded part which extends from the second flat surface part and is folded toward the first flat surface part; and may be substantially perpendicular to the first flat surface part and the second flat surface part.

In the flexible printed circuit according to one embodiment of the disclosure, the first connection part: may include a first folded part which extends from the first flat surface part and is folded toward a direction opposite to the second flat surface part; a second folded part which extends from the second flat surface part and is folded toward a direction opposite to the first flat surface part; and a bent part which is interposed between the first folded part and the second folded part and has a substantially circular shape.

The flexible printed circuit according to one embodiment of the disclosure may further include an opening formed through positions at which sides of the first flat surface part and/or the second flat surface part and the connection part meet each other.

In the flexible printed circuit according to one embodiment of the disclosure, the first end portion is connected to an electronic component, and the second end portion is connected to a printed circuit board spaced apart from the electronic component so as to electrically and/or operatively connect the electronic component and the printed circuited board.

In the flexible printed circuit according to one embodiment of the disclosure, the flexible printed circuit board may include a third end portion substantially parallel to the first plane, and the third end portion may be connected to the printed circuit board and extend from the first end portion.

The flexible printed circuit according to one embodiment of the disclosure may further include a third flat surface part, a fourth flat surface part, and a second connection part which are interposed between the first end portion and the third end portion; the third flat surface part may extend from the first end portion toward the third end portion, and be bent to be substantially parallel to the second plane; the fourth flat surface part may extend from the third end portion toward the first end portion, be substantially parallel to the second plane, and face away from the third flat surface part; and the second connection part may extend from each of the third flat surface part and the fourth flat surface part so as to be parallel to a third plane, and be bent so as to connect the third flat surface part and the fourth flat surface part.

In the flexible printed circuit according to one embodiment of the disclosure, the first flat surface part and the third flat surface part may extend toward directions opposite to each other with reference to the first end portion, so as to allow the first connection part and the second connection part to face away from each other.

The various embodiments of the disclosure described and shown in the specification and the drawings have been presented to easily explain the technical contents of the disclosure and help understanding of the disclosure, and are not intended to limit the scope of the disclosure. Therefore, the scope of the disclosure should be construed to include, in addition to the embodiments disclosed herein, all changes and modifications derived on the basis of the technical idea of the disclosure.

The invention claimed is:

1. An electronic device comprising:
    a housing comprising a front plate and a rear plate facing away from the front plate;
    a first printed circuit board disposed between the front plate and the rear plate;
    an electronic component disposed between the front plate and the rear plate and disposed on a first plane which is substantially identical to the first printed circuit board; and
    a second printed circuit board connecting the electronic component to the first printed circuit board,
    wherein the second printed circuit board comprises:
        a first end portion which is parallel to the first plane and is connected to the electronic component,
        a second end portion which is parallel to the first end portion and is connected to the first printed circuit board,
        a first flat surface part which extends from the first end portion toward the second end portion and is parallel to a second plane substantially perpendicular to the first plane,
        a second flat surface part, which extends from the second end portion toward the first end portion, is parallel to the second plane, and faces away from the first flat surface part, and
        a connection part, which extends from each of the first flat surface part and the second flat surface part toward a third plane substantially perpendicular to the first plane and the second plane, and is bent so as to connect the first flat surface part and the second flat surface part, and
    wherein the connection part comprises:
        a first folded part which extends from the first flat surface part and is folded toward a direction opposite to the second flat surface part,
        a second folded part which extends from the second flat surface part and is folded toward a direction opposite to the first flat surface part, and
        a bent part which is interposed between the first folded part and the second folded part and has a substantially circular shape.

2. The electronic device of claim 1, wherein the first flat surface part and the second flat surface part have different heights so as to allow the first end portion and the second end portion to have different heights.

3. The electronic device of claim 1, wherein the first flat surface part and the second flat surface part have different lengths.

4. The electronic device of claim 1, wherein the connection part comprises:
   a first folded part which extends from the first flat surface part and is folded toward the second flat surface part, and
   a second folded part which extends from the second flat surface part and is folded toward the first flat surface part, and is substantially perpendicular to the first flat surface part and the second flat surface part.

5. The electronic device of claim 1, further comprising:
   openings formed through positions at which sides of the first flat surface part or the second flat surface part and the connection part meet each other.

6. The electronic device of claim 1, further comprising:
   a mounting part for mounting the electronic component,
   wherein the mounting part comprises a partition wall formed along an edge of the electronic component.

7. The electronic device of claim 6, wherein the partition wall comprises a slit part positioned to allow at least a part of the connection part to extend therethrough.

8. The electronic device of claim 6, wherein the partition wall is formed at the housing of the electronic device or is formed at a support member interposed between the front plate and the rear plate.

9. The electronic device of claim 1,
   wherein the electronic component comprises a battery, and
   wherein the second printed circuit board electrically or operatively connects the battery and a power management module mounted on the first printed circuit board.

10. A flexible printed circuit board comprising:
   a first end portion parallel to a first plane;
   a second end portion substantially parallel to the first plane; and
   a cushioning part interposed between the first end portion and the second end portion,
   wherein the cushioning part comprises:
      a first flat surface part extending from the first end portion toward the second end portion;
      a first bent part interposed between the first end portion and the first flat surface part, and bent such that the first flat surface part is parallel to a second plane substantially perpendicular to the first plane;
      a second flat surface part extending from the second end portion toward the first end portion;
      a second bent part interposed between the second end portion and the second flat surface part, and bent such that the second flat surface part is parallel to the second plane; and
      a first connection part, which extends from each of the first flat surface part and the second flat surface part so as to be parallel to a third plane substantially perpendicular to the first plane and the second plane and is bent so as to connect the first flat surface part and the second flat surface part, and
   wherein the first connection part comprises:
      a first folded part which extends from the first flat surface part and is folded toward a direction opposite to the second flat surface part,
      a second folded part which extends from the second flat surface part and is folded toward a direction opposite to the first flat surface part, and
      a bent part which is interposed between the first folded part and the second folded part and has a substantially circular shape.

11. The flexible printed circuit board of claim 10,
   wherein the first end portion is connected to an electronic component, and
   wherein the second end portion is connected to a printed circuit board spaced apart from the electronic component so as to electrically and/or operatively connect the electronic component and the printed circuited board.

12. The flexible printed circuit board claim 11, further comprising:
   a third end portion substantially parallel to the first plane,
   wherein the third end portion is connected to the printed circuit board and extends from the first end portion.

13. The flexible printed circuit board of claim 12, further comprising:
   a third flat surface part;
   a fourth flat surface part; and
   a second connection part which are interposed between the first end portion and the third end portion,
   wherein: the third flat surface part extends from the first end portion toward the third end portion, and is bent to be substantially parallel to the second plane,
   wherein the fourth flat surface part extends from the third end portion toward the first end portion, is substantially parallel to the second plane, and faces away from the third flat surface part, and
   wherein the second connection part extends from each of the third flat surface part and the fourth flat surface part so as to be parallel to a third plane, and is bent so as to connect the third flat surface part and the fourth flat surface part.

14. The flexible printed circuit board of claim 13, wherein the first flat surface part and the third flat surface part extend toward directions opposite to each other with reference to the first end portion, so as to allow the first connection part and the second connection part to face away from each other.

15. The flexible printed circuit board of claim 10, wherein the first flat surface part and the second flat surface part have different heights so as to allow the first end portion and the second end portion to have different heights.

16. The flexible printed circuit board of claim 10, wherein the first flat surface part and the second flat surface part have different lengths.

17. The flexible printed circuit board of claim 10, wherein the first connection part comprises:
   a first folded part which extends from the first flat surface part and is folded toward the second flat surface part, and
   a second folded part which extends from the second flat surface part and is folded toward the first flat surface part, and is substantially perpendicular to the first flat surface part and the second flat surface part.

18. The flexible printed circuit board of claim 10, further comprising:
   an opening formed through positions at which sides of the first flat surface part or the second flat surface part and the first connection part meet each other.

* * * * *